US011268857B2

(12) United States Patent
Nakamura et al.

(10) Patent No.: US 11,268,857 B2
(45) Date of Patent: Mar. 8, 2022

(54) SPECTRUM ANALYSIS METHOD AND SPECTRUM ANALYSIS APPARATUS

(71) Applicant: TOYO CORPORATION, Tokyo (JP)

(72) Inventors: Tetsuya Nakamura, Tokyo (JP); Naoki Tsuboi, Tokyo (JP)

(73) Assignee: TOYO CORPORATION, Tokyo (JP)

( * ) Notice: Subject to any disclaimer, the term of this patent is extended or adjusted under 35 U.S.C. 154(b) by 394 days.

(21) Appl. No.: 16/468,908

(22) PCT Filed: May 25, 2018

(86) PCT No.: PCT/JP2018/020198
§ 371 (c)(1),
(2) Date: Jun. 12, 2019

(87) PCT Pub. No.: WO2019/225014
PCT Pub. Date: Nov. 28, 2019

(65) Prior Publication Data
US 2021/0325247 A1  Oct. 21, 2021

(51) Int. Cl.
*G01J 3/28* (2006.01)

(52) U.S. Cl.
CPC ....... *G01J 3/2889* (2013.01); *G01J 2003/283* (2013.01)

(58) Field of Classification Search
CPC ...... G01J 3/28; G01J 3/2889; G01J 2003/283; G06K 9/00543; G01R 13/0254; G01R 13/0263; G01R 23/16
See application file for complete search history.

(56) References Cited

U.S. PATENT DOCUMENTS 6,859,275 B2 * 2/2005 Fateley ............... G01J 3/02
356/310
7,759,925 B2 * 7/2010 Nara ............... G01R 13/0254
324/76.19

(Continued)

FOREIGN PATENT DOCUMENTS

JP   55-141853   11/1980
JP   10-155232   6/1998

(Continued)

OTHER PUBLICATIONS

International Search Report (ISR) dated Aug. 7, 2018 in International (PCT) Application No. PCT/JP2018/020198.

(Continued)

*Primary Examiner* — Mohamed K Amara
(74) *Attorney, Agent, or Firm* — Wenderoth, Lind & Ponack, L.L.P.

(57) ABSTRACT

Provided is a spectrum analysis method including: accumulating n spectrums obtained by consecutively fast Fourier transforming an input signal n times; receiving a threshold; identifying, in the n spectrums accumulated in the accumulating, frequently occurring data that includes data whose number of occurrences exceeds the threshold received in the receiving, the number of occurrences being defined as a total number of items of data at a same frequency point that indicate levels that are close to each other, to within a predetermined range; selecting a maximum level at each of the frequency points from among only the identified frequently occurring data; and outputting a spectrum indicating the maximum levels selected at the frequency points.

8 Claims, 12 Drawing Sheets

(56) References Cited

U.S. PATENT DOCUMENTS

| | | | |
|---|---|---|---|
| 8,489,350 B2* | 7/2013 | Engholm | G01R 13/0263 702/66 |
| 8,706,435 B2* | 4/2014 | Engholm | G01R 13/0227 702/77 |
| 9,513,320 B2* | 12/2016 | Whisenand | G01R 31/28 |
| 10,459,008 B2* | 10/2019 | Tracy | G01R 13/0263 |
| 2003/0198304 A1* | 10/2003 | Sugar | G01R 13/0254 375/340 |
| 2004/0100244 A1 | 5/2004 | Kurosawa | |
| 2007/0027675 A1 | 2/2007 | Hertz | |
| 2008/0143316 A1 | 6/2008 | Nara | |
| 2009/0290793 A1* | 11/2009 | Engholm | G01R 13/029 382/171 |
| 2009/0302829 A1 | 12/2009 | Kanoh et al. | |
| 2011/0112772 A1* | 5/2011 | Yost | G01J 3/28 702/24 |
| 2017/0016781 A1* | 1/2017 | Dave | B23K 9/0953 |
| 2019/0212273 A1* | 7/2019 | Scoullar | G01V 5/0016 |

FOREIGN PATENT DOCUMENTS

| | | |
|---|---|---|
| JP | 2001-42033 | 2/2001 |
| JP | 2003-315391 | 11/2003 |
| JP | 2005-39345 | 2/2005 |
| JP | 2005-181177 | 7/2005 |
| JP | 2008-26188 | 2/2008 |
| JP | 2008-39762 | 2/2008 |
| WO | 02/073222 | 9/2002 |
| WO | 2008/023640 | 2/2008 |

OTHER PUBLICATIONS

International Preliminary Report on Patentability (IPRP) dated Dec. 18, 2018 in International (PCT) Application No. PCT/JP2018/020198.

"DPX Acquisition Technology for Spectrum Analyzers Fundamentals", Tektronix, Inc., 2008, with its English version.

* cited by examiner

SPECTRUM ANALYSIS METHOD AND SPECTRUM ANALYSIS APPARATUS

TECHNICAL FIELD

The present invention is related to a spectrum analysis method and spectrum analysis apparatus, and in particular, to a spectrum analysis method of generating a spectrum by holding a maximum level at each frequency point over a plurality of spectrums obtained by fast Fourier transform (FFT).

BACKGROUND ART

Electro-magnetic waves emitted by electronic components may cause electro-magnetic interference (EMI) that adversely affects the function of, for example, other electronic components. Accordingly, official authorities such as the International Special Committee on Radio Interference (CISPR) and the American National Standards Institute (ANSI) have come up with EMI related industrial standards (hereinafter simply referred to as "standards"), and the levels stipulated in the standards are regulated by, for example, the American, Chinese, and Japanese governments. The CISPR 32 standards, for example, stipulate limits in various detection methods such as peak value, quasi-peak value, and average value detection methods, and conformity to the standards is determined based on whether these limits are exceeded or not.

Conventionally, in order to determine conformity to standards, the maximum level of radiated disturbance (hereinafter simply referred to as "noise") and the frequency corresponding to the maximum level are identified, etc., using the Max Hold mode in a swept spectrum analyzer. As used herein, the term "Max Hold" refers to keeping and outputting (for example, displaying) the maximum level of each frequency point in the spectrum after each sweep. The term "frequency point" refers to each of frequency bands (bands corresponding to frequency resolution) on the horizontal axis of the spectrum (i.e., the frequency axis). The term "level" refers to the values on the vertical axis of the spectrum, and indicates, for example, signal power.

Since spectrums are obtained by sweeping or scanning frequencies with a swept spectrum analyzer, it is not possible to obtain a spectrum of noise when there is no noise in the frequency being swept or scanned. Accordingly, it is difficult to capture impulse noise such as noise having only a specific frequency component.

To address this, one proposed conventional method includes using a fast Fourier transform (FFT)-based spectrum analyzer to measure radiated disturbances. One merit of the FFT-based spectrum analyzer disclosed in patent literature (PTL) 1 is that it achieves high-quality measurement that does not fail to pick up impulse noise since the sweeping or scanning of frequencies is not necessary. Note that an FFT-based spectrum analyzer is a frequency analyzer that uses FFT (including not only general purpose spectrum analyzers but also EMI receivers specialized for EMI measurement).

CITATION LIST

Patent Literature

[PTL 1] WO 2008/023640

SUMMARY OF INVENTION

Technical Problem

However, when Max Hold is performed using the FFT-based spectrum analyzer disclosed in PTL 1, if impulse noise, which includes frequency components spanning a wide band of frequencies, is input even once during the measurement, noise necessary for the final evaluation (i.e., noise that occurs frequently) is covered and hidden by the impulse noise spectrum, making it impossible to determine conformity to standards.

In CISPR 32, with respect to impulse noise, infrequent emissions (i.e., noise) are ignored when determining whether the limits are exceeded or not. Specifically, Annex C of CISPR 32, Edition 2, stipulates that if the level of an isolated emission exceeds any relevant limit, it shall be ignored, provided that the following two conditions are met when measured over a two minute interval: 1) the emission does not exceed the limit for more than one second; and 2) the emission does not exceed the limit more than once in any 15 second observation period. Annex A of CISPR 32, Edition 2, stipulates that the peak detector limits in Table A.3 and Table A.5 (description of these tables is omitted herein) shall not be applied to emissions produced by arcs or sparks that are high voltage breakdown events. The Max Hold result of the FFT-based spectrum analyzer disclosed in PTL 1 includes infrequent noise that coincides with these exceptions described in CISPR 32.

FIG. 1 illustrates a problem that may occur when Max Hold is performed using a conventional FFT-based spectrum analyzer. FIG. 1 illustrates 10 spectrums (bold and thin solid lines) obtained over 10 seconds (i.e., 10 measurements (FFTs) taken (performed) one per second). Frequency is represented on the horizontal axis, and each interval between marks indicating the scale of the horizontal axis corresponds to a frequency point. Level is represented on the vertical axis. The scale of the vertical axis is arbitrarily set for Max Hold and defines the units in which level is expressed (for example, the scale is set to a value equal to 100 times the resolution of the level of the spectrum analyzer). Each value in FIG. 1 indicates the number of items (i.e., the number of occurrences) of data indicating that level at that frequency point. There are a total of 10 numbers of occurrences at each frequency point (since the data consists of 10 spectrums).

In this example, since impulse noise was input once, the result is a spectrum (the bold solid line) exhibiting high levels across all frequency points. When Max Hold is performed on such 10 spectrums, only the spectrum of the impulse noise (the bold solid line) is displayed.

However, the impulse noise displayed by the Max Hold is noise that occurred only once over the 10 seconds, and is not necessary for making the final evaluation. Frequently occurring noise necessary for making the final evaluation (in this example, spectrums (thin solid lines) including noise that occurs two times or more over the 10 seconds) is covered and hidden by the spectrum of the impulse noise that is not necessary for making the final evaluation, and thus not represented in the result of the Max Hold. Stated differently, infrequent impulse noise not necessary for making the final evaluation, such as impulse noise that occurs only once during measurement, adversely affects the Max Hold result of a conventional FFT-based spectrum analyzer, making it impossible to obtain a spectrum of frequently occurring noise necessary for determining conformity to standards.

In view of this, the present invention has an object to provide a spectrum analysis method and a spectrum analysis apparatus that make it possible to perform Max Hold using a FFT-based spectrum analyzer on the targeted frequently occurring noise without being adversely affected by infrequent impulse noise generated during measurement.

Solution to Problem

In order to achieve the above object, a spectrum analysis method according to one aspect of the present invention includes: accumulating n spectrums, each indicating a level at each of m frequency points, obtained by consecutively fast Fourier transforming an input signal n times, where n is an integer of at least 2, and m is an integer of at least 2; receiving a threshold; identifying, in the n spectrums accumulated in the accumulating, frequently occurring data that includes data whose number of occurrences exceeds the threshold received in the receiving, the number of occurrences being defined as a total number of items of data at a same frequency point that indicate levels that are close to each other, to within a predetermined range; selecting a maximum level at each of the m frequency points from among only the frequently occurring data identified in the identifying; and outputting a spectrum indicating the maximum levels selected at the m frequency points in the selecting.

In order to achieve the above object, a spectrum analysis apparatus according to one aspect of the present invention includes: a storage unit configured to accumulate n spectrums, each indicating a level at each of m frequency points, obtained by consecutively fast Fourier transforming an input signal n times, where n is an integer of at least 2, and m is an integer of at least 2; an input unit configured to receive a threshold; a filter unit configured to identify, in the n spectrums accumulated by the storage unit, frequently occurring data that includes data whose number of occurrences exceeds the threshold received by the input unit, the number of occurrences being defined as a total number of items of data at a same frequency point that indicate levels that are close to each other, to within a predetermined range; a Max Hold unit configured to select a maximum level at each of the m frequency points from among only the frequently occurring data identified by the filter unit; and an output unit configured to output a spectrum indicating the maximum levels selected at the m frequency points by the Max Hold unit.

Advantageous Effects of Invention

According to the present invention, a spectrum analysis method and a spectrum analysis apparatus are realized that make it possible to perform Max Hold using a FFT-based spectrum analyzer on the targeted frequently occurring noise without being adversely affected by infrequent impulse noise generated during measurement.

DESCRIPTION OF EMBODIMENTS

Hereinafter, an embodiment of the present invention is described in detail with reference to the figures. Note that the embodiment described below indicates a specific example of the present invention. The numerical values, the elements, the arrangement and connection of the elements, the steps, the processing order of the steps, etc., indicated in the following embodiment are mere examples, and therefore do not limit the scope of the present invention. Among the elements in the following embodiment, those not recited in any of the independent claims defining the broadest concept of the present invention are described as optional elements. Note that the figures are schematic illustrations and are not necessarily precise depictions. Also note that in the figures, elements that are essentially the same share like reference signs. Accordingly, overlapping description will be omitted or simplified.

Figure 2:
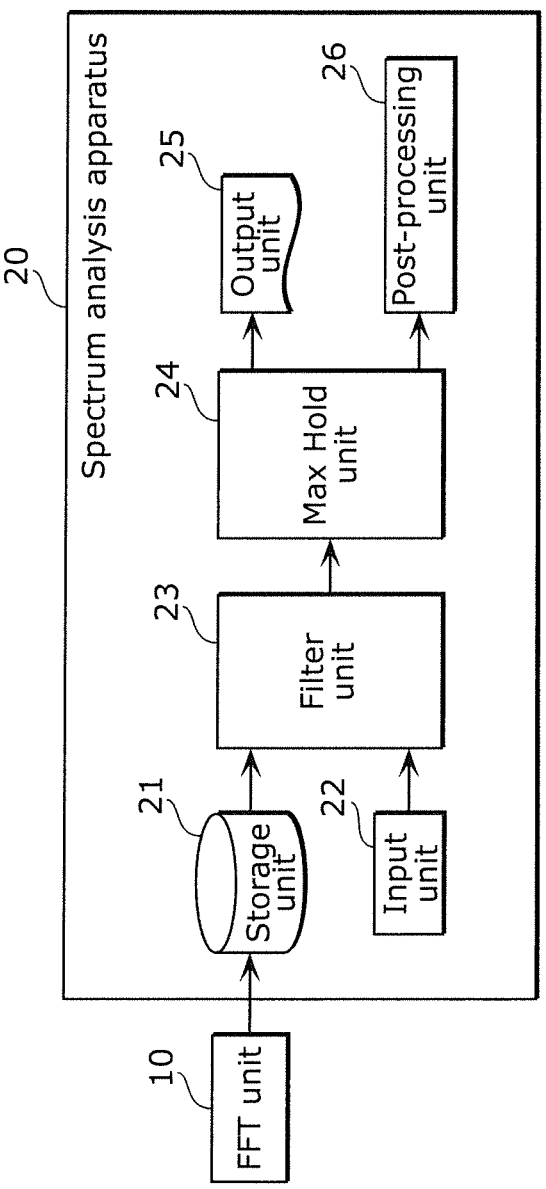
FIG. 2 is a block diagram of a configuration of a spectrum analysis apparatus according to an embodiment.

FIG. 2 is a block diagram of a configuration of a spectrum analysis apparatus 20 according to the embodiment. FIG. 2 also illustrates an FFT unit 10 that generates spectrums to be obtained by the spectrum analysis apparatus 20.

The FFT unit 10 is a computing unit that consecutively fast Fourier transforms an input signal (in this example, noise) n (n is an integer of at least 2) times to generate n spectrums, each indicating a level at each of m (m is an integer of at least 2) frequency points. For example, the FFT unit 10 is an FFT-based spectrum analyzer. Note that the range of frequencies to be fast Fourier transformed, the number of scans (i.e., "n" described above), frequency resolution (i.e., "m" described above), etc., are determined in advance by, for example, user instruction made via the FFT unit 10, or through control by the spectrum analysis apparatus 20 in possession of a user instruction.

The spectrum analysis apparatus 20 is an apparatus that performs analysis, including Max Hold, on only frequently occurring noise in the n spectrums generated by the FFT unit 10. The spectrum analysis apparatus 20 includes a storage unit 21, an input unit 22, a filter unit 23, a Max Hold unit 24, an output unit 25, and a post-processing unit 26.

The storage unit 21 is memory that accumulates n spectrums generated by the FFT unit 10, and is, for example, non-volatile semiconductor memory.

The input unit 22 is an input device that receives various instructions from a user, including a threshold to be used by filter unit 23, and is, for example, a keyboard or buttons.

The filter unit 23 is a signal processing unit that identifies frequently occurring data in the n spectrums accumulated in the storage unit 21. The frequently occurring data includes items of data whose number of occurrences exceeds the threshold received by the input unit 22. The number of occurrences is defined as the number of items of data at the same frequency point that indicate levels that are close to each other, to within a predetermined range. Note that the frequency bandwidth (or number of frequency points) and the level margin (i.e., the predetermined range described above) that define the unit in which the numbers of occurrences are counted are set in advance by, for example, user instruction made via the input unit 22.

The Max Hold unit 24 is a signal processing unit that selects a maximum level at each of the m frequency points from among only the frequently occurring data identified by the filter unit 23.

The output unit 25 is a device that outputs a spectrum indicating the maximum levels selected at the m frequency points by the Max Hold unit 24 (i.e., outputs a result of the Max Hold), and is, for example, a signal output interface, such as a display, storage medium, or GPIB (IEEE488).

The post-processing unit 26 is a signal processing unit that performs post-processing using the spectrum generated by the Max Hold unit 24 that indicates the maximum levels at the m frequency points. More specifically, the post-processing unit 26 obtains time-variant data indicating changes over time in the level of the frequency corresponding to the highest level in the spectrum generated by the Max Hold unit 24, and calculates and outputs durations of time that the obtained time-variant data exceeds a specified upper limit and an interval of time between events exceeding the specified upper limit.

Note that the filter unit 23, the Max Hold unit 24, and the post-processing unit 26 may be implemented as software, using, for example, ROM storing a program, RAM, a processor that executes the program, a timer and/or calendar, an input/output circuit, etc., and, alternatively, may be implemented as hardware, using specialized electronic circuitry, such as an ASIC. Moreover, the spectrum analysis apparatus 20 may be collectively implemented as an independent processing apparatus, such as one or more personal computers (PCs). Alternatively, part or all of the spectrum analysis apparatus 20 may be included in the spectrum analyzer including the FFT unit 10.

Next, operations performed by the spectrum analysis apparatus 20 according to this embodiment having the configuration described above will be described.

Figure 3:
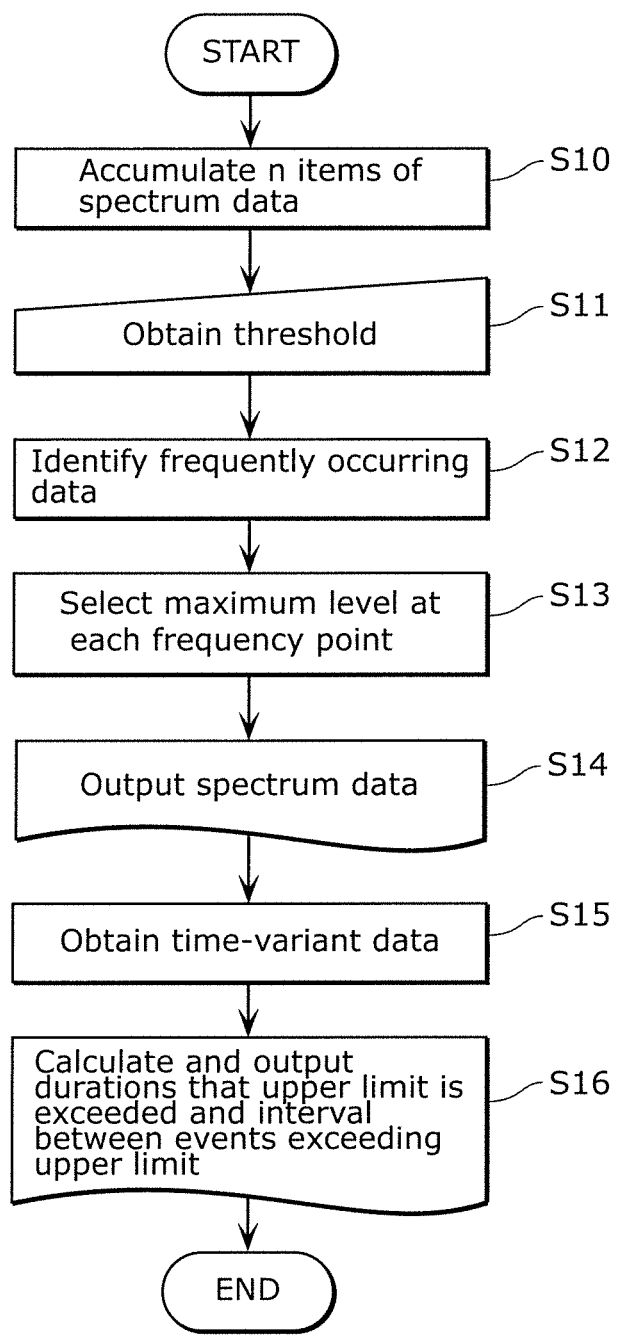
FIG. 3 is a flow chart of the primary operations performed by a spectrum analysis apparatus according to the embodiment.

FIG. 3 is a flow chart of the primary operations performed by the spectrum analysis apparatus 20 according to the embodiment (i.e., a flow chart of the spectrum analysis method).

First, the spectrum analysis apparatus 20 accumulates, in the storage unit 21, n spectrums generated by the FFT unit 10 (accumulating step S10). For example, a piece of equipment under test (EUT) is placed on a turn table, the turn table is rotated one full rotation over the span of 10 seconds, and noise radiating from the EUT while the turn table is rotating is received by a fixed antenna to obtain a signal. The spectrum analysis apparatus 20 fast Fourier transforms this signal 10 times to generate 10 spectrums, outputs the 10 spectrums from the FFT unit 10, and accumulates the 10 spectrums in the storage unit 21.

Next, input unit 22 obtains, from a user, a threshold to be used by the filter unit 23 down the line (receiving step S11). For example, the input unit 22 obtains, from the user, a value of 1 as a low number of occurrences desired to be excluded from the final evaluation (i.e., the input unit 22 obtains an instruction to exclude items of data whose number of occurrences is at most one from among the 10 spectrums obtained over 10 seconds).

Note that the accumulating step S10 and the receiving step S11 are not limited to being performed in this order; the order may be reversed and, alternatively, the steps may be performed in parallel. Moreover, when the threshold is set in advance (i.e., when the threshold is stored in the spectrum analysis apparatus 20), the receiving step S11 may be omitted and the set value may be used as the threshold instead.

Next, the filter unit 23 identifies frequently occurring data in the n spectrums accumulated in the storage unit 21. The frequently occurring data includes items of data whose number of occurrences exceeds the threshold received by the input unit 22. The number of occurrences is defined as the number of items of data at the same frequency point that indicate levels that are close to each other, to within a predetermined range (filtering step S12). More specifically, the filter unit 23 identifies frequently occurring data at each of the m frequency points. The frequently occurring data at a given frequency point being, from among the data indicating the levels at the given frequency point in the n spectrums accumulated in the accumulating step S10, data whose number of occurrences exceeds the threshold received in the receiving step. In this embodiment, the frequently occurring data is the sample of data whose number of occurrences exceeds the threshold received in the receiving step, from among the items of data indicating the levels at a given frequency point in the n spectrums, the number of occurrences being the number of items of data indicating the same level at the given frequency point.

For example, assume 10 spectrums obtained over 10 seconds are accumulated in the storage unit 21 and a threshold of 1 is input. In this example, at each frequency point, the filter unit 23 identifies the collection of data that indicates the same level and has a number of occurrences that exceeds 1 as frequently occurring data.

The Max Hold unit 24 is a signal processing unit that selects a maximum level at each of the m frequency points from among only the frequently occurring data identified by the filter unit 23 (Max Hold step S13).

Figure 1:
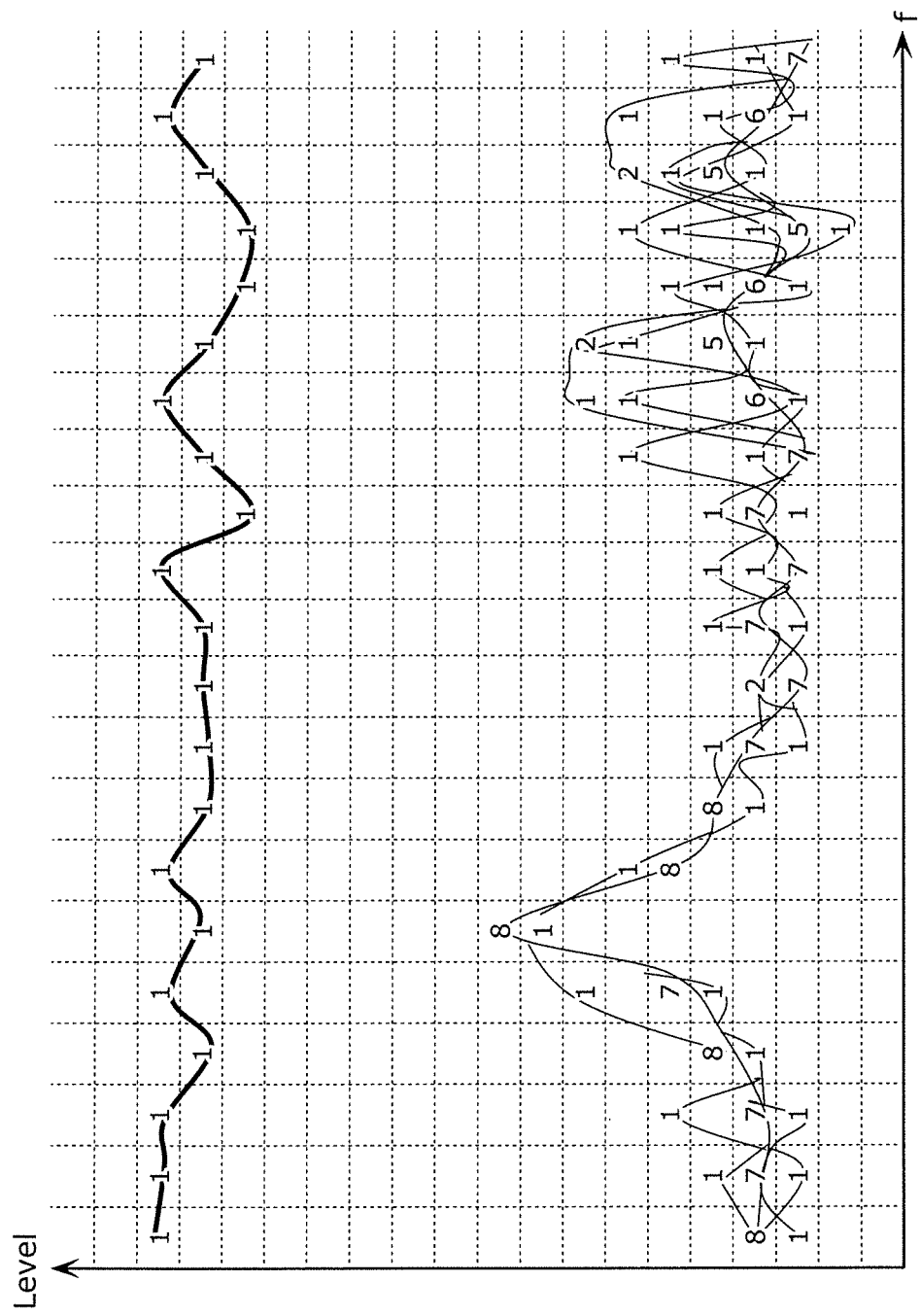
FIG. 1 illustrates a problem that may occur when Max Hold is performed using a conventional FFT-based spectrum analyzer.
Figure 4:
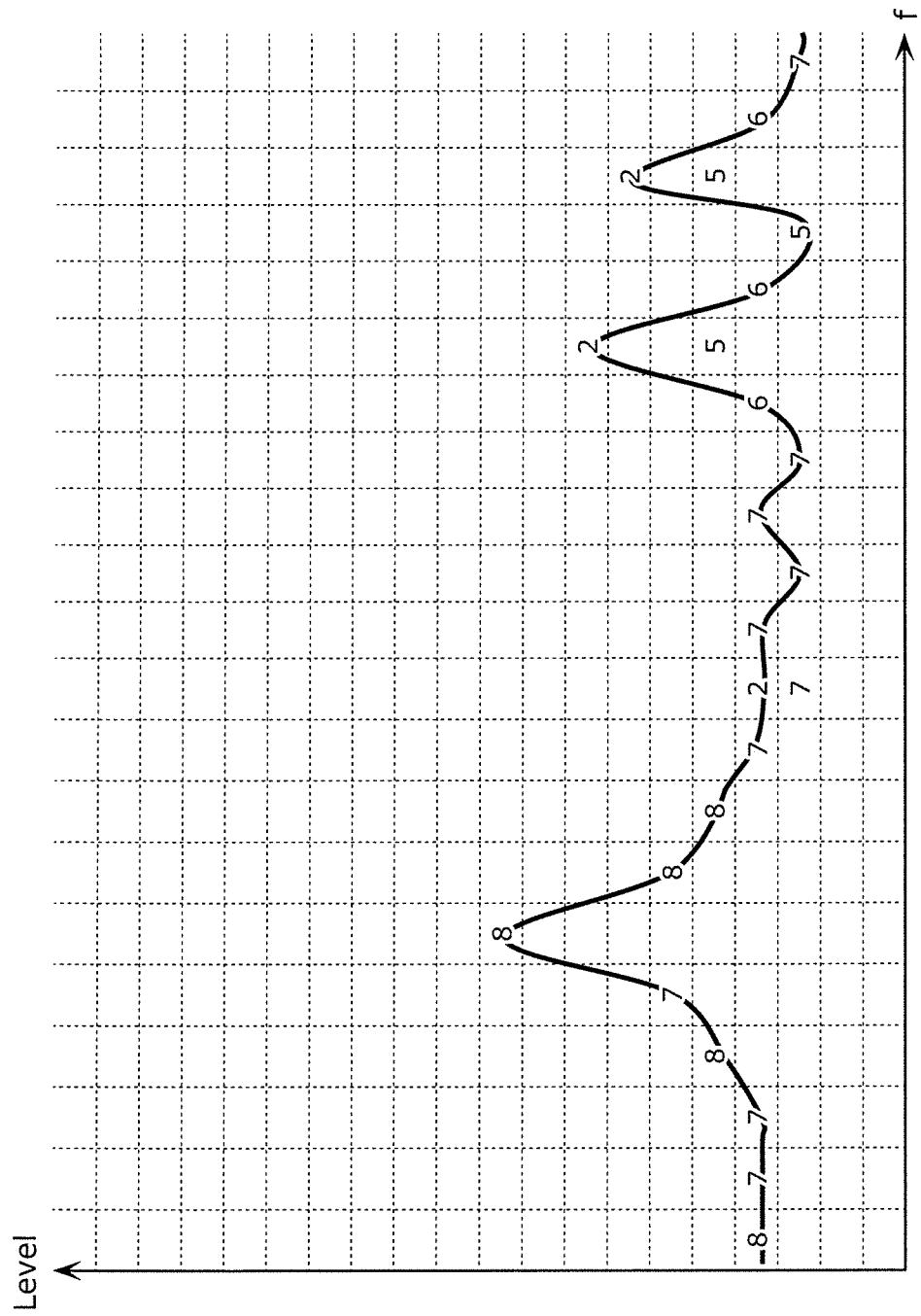
FIG. 4 illustrates an example of (a spectrum of) data selected by a Max Hold unit in the spectrum analysis apparatus according to the embodiment.

For example, when, from the 10 spectrums obtained over 10 seconds, the filter unit 23 identifies, at each frequency point, data whose number of occurrences exceeds 1 as frequently occurring data, the Max Hold unit 24 selects the maximum level at each frequency point, as illustrated in FIG. 4. FIG. 4 illustrates an example of (a spectrum of) data selected by the Max Hold unit 24 in the spectrum analysis apparatus 20 according to this embodiment. Data indicating the maximum level at each frequency point from among the data whose number of occurrences exceeds 1 is graphed (bold solid line). For example, looking at the third frequency point from the far right on the horizontal axis (the third from the highest frequency point), data whose number of occurrences exceeds 1 includes data whose number of occurrences is 2 and 5. Among this data, the data indicating the maximum level has a number of occurrences of 2, so the data whose number of occurrences is 2 is selected. Similarly, at each of the frequency points, the data indicating the maximum level is selected from among data whose number of occurrences exceeds 1. Note that just like in FIG. 1, in the spectrum illustrated in FIG. 4, the vertical axis (indicating level) indicates values expressed in units defined by the scale arbitrarily set for Max Hold. This also applies to subsequent figures that illustrate spectrums.

Next, the output unit 25 outputs a spectrum indicating the maximum levels at the m frequency points selected by the Max Hold unit 24 (i.e., outputs a result of the Max Hold) (outputting step S14). For example, output unit 25 outputs the spectrum generated by the Max Hold unit 24 (the bold solid line in FIG. 4) to a display.

Next, when an instruction to execute the post-processing unit 26 is received via the input unit 22, the post-processing unit 26 obtains time-variant data indicating changes over time in the level of the frequency corresponding to the highest level in the spectrum generated by the Max Hold unit 24 (S15), and calculates and outputs (for example, to a display) durations of time that the obtained time-variant data exceeds an upper limit specified via the input unit 22 and an interval of time between events exceeding the specified upper limit (S16). Note that in the obtaining of the time-variant data, for example, results of the levels at the frequency are consecutively obtained from the FFT unit 10 while the filter unit 23 and the Max Hold unit 24 not functioning.

Figure 5:
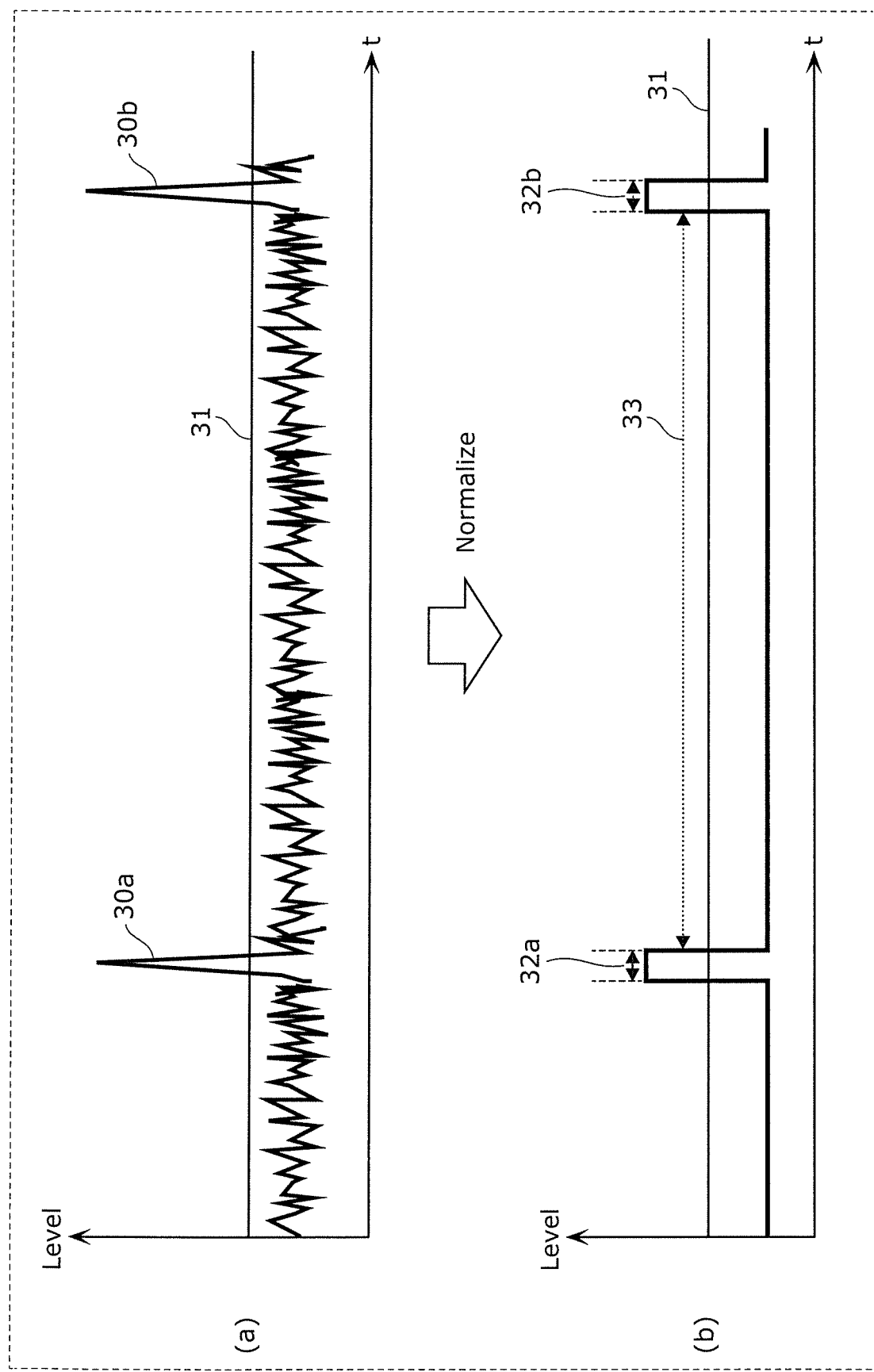
FIG. 5 illustrates processes performed by a post-processing unit in the spectrum analysis apparatus according to the embodiment.

FIG. 5 illustrates processes performed by the post-processing unit 26 in the spectrum analysis apparatus 20 according to the embodiment. In FIG. 5, (a) illustrates one example of time-variant data generated by the post-processing unit 26. This data shows changes over time in the level of the frequency corresponding to the highest level in the spectrum generated by the Max Hold unit 24. The data shows two peaks 30a and 30b in two locations. The horizontal line 31 traversing the two peaks 30a and 30b is one example of the upper limit specified via the input unit 22.

In FIG. 5, (b) illustrates data after the post-processing unit 26 has normalized the time-variant data illustrated in (a) in FIG. 5 (i.e., after the post-processing unit 26 has smoothed the data other than the peaks 30a and 30b into a flat horizontal line). After normalizing the time-variant data illustrated in (a) in FIG. 5, the post-processing unit 26 compares the normalized time-variant data with the upper limit to identify and output (for example, to a display) durations of time 32a and 32b that the normalized time-variant data exceeds the upper limit specified via the input unit 22 and an interval 33 between events exceeding the upper limit.

By looking at the results of such processing performed by the post-processing unit 26 (i.e., the durations and intervals of time described above), it is easy to determine whether or not the measured noise is noise that coincides with the exceptions in Annexes A and C of CISPR 32, Edition 2 described above.

As described above, the spectrum analysis method according to this embodiment includes: an accumulating step S10 of accumulating n spectrums, each indicating a level at each of m frequency points, obtained by consecutively fast Fourier transforming an input signal n times, where n is an integer of at least 2, and m is an integer of at least 2; a receiving step S11 of receiving a threshold; a filtering step S12 of identifying, in the n spectrums accumulated in the accumulating step S10, frequently occurring data that includes data whose number of occurrences exceeds the threshold received in the receiving step S11, the number of occurrences being defined as a total number of items of data at a same frequency point that indicate levels that are close to each other, to within a predetermined range; a Max Hold step S13 of selecting a maximum level at each of the m frequency points from among only the frequently occurring data identified in the filtering step S12; and an outputting step S14 of outputting a spectrum indicating the maximum levels selected at the m frequency points in the Max Hold step S13.

With this, since Max Hold is performed in the Max Hold step S13 after excluding infrequent data in the filtering step S12, it is possible to perform Max Hold using an FFT-based spectrum analyzer on the targeted frequently occurring noise, without being adversely affected by infrequent impulse noise generated during measurement.

In the filtering step S12, the frequently occurring data is identified at each of the m frequency points, the frequently occurring data at a given frequency point being, from among data indicating a level at the given frequency point in the n spectrums accumulated in the accumulating step S10, the data whose number of occurrences exceeds the threshold received in the receiving step S11.

This makes it possible to select data to be excluded from the data to be used in the Max Hold at each of the m frequency points. Accordingly, data that infrequently occurs can be reliably excluded at any given frequency point.

The frequently occurring data is, from among the data indicating a level at the given frequency point in the n spectrums, items of data that indicate the same level and occur more than the threshold received in the receiving step S11.

With this, when the number of occurrences is defined as the number of items of data indicating the same level, only data whose number of occurrences is higher than the threshold is subjected to the Max Hold.

The spectrum analysis method further includes post-processing steps (S15, S16) including obtaining time-variant data indicating changes over time in a level of a frequency corresponding to a highest level in the spectrum indicating the maximum levels selected at the m frequency points in the Max Hold step S13, and calculating and outputting durations of time that the obtained time-variant data exceeds a specified upper limit and an interval of time between events exceeding the specified upper limit.

With this, it is easy to determine whether or not the measured noise is noise that coincides with the exceptions in Annexes A and C of CISPR 32, Edition 2 described above.

a spectrum analysis apparatus according to this embodiment includes: a storage unit 21 configured to accumulate n spectrums, each indicating a level at each of m frequency points, obtained by consecutively fast Fourier transforming an input signal n times, where n is an integer of at least 2, and m is an integer of at least 2; an input unit 22 configured to receive a threshold; a filter unit 23 configured to identify, in the n spectrums accumulated by the storage unit 21, frequently occurring data that includes data whose number of occurrences exceeds the threshold received by the input unit 22, the number of occurrences being defined as a total number of items of data at a same frequency point that indicate levels that are close to each other, to within a predetermined range; a Max Hold unit 24 configured to select a maximum level at each of the m frequency points from among only the frequently occurring data identified by the filter unit 23; and an output unit 25 configured to output a spectrum indicating the maximum levels selected at the m frequency points by the Max Hold unit 24.

With this, since Max Hold is performed by the Max Hold unit 24 after infrequent data is excluded by the filter unit 23, it is possible to perform Max Hold using an FFT-based spectrum analyzer on the targeted frequently occurring noise, without being adversely affected by infrequent impulse noise generated during measurement.

Variation 1

Next, a spectrum analysis apparatus and method according to Variation 1 of the above embodiment will be described.

The spectrum analysis apparatus 20 according to the above embodiment is more beneficial than the prior art in that Max Hold is performed after excluding infrequent impulse noise, but infrequent data other than impulse noise is also excluded. This is problematic if one's goal is to exclude only impulse noise.

Figure 6:
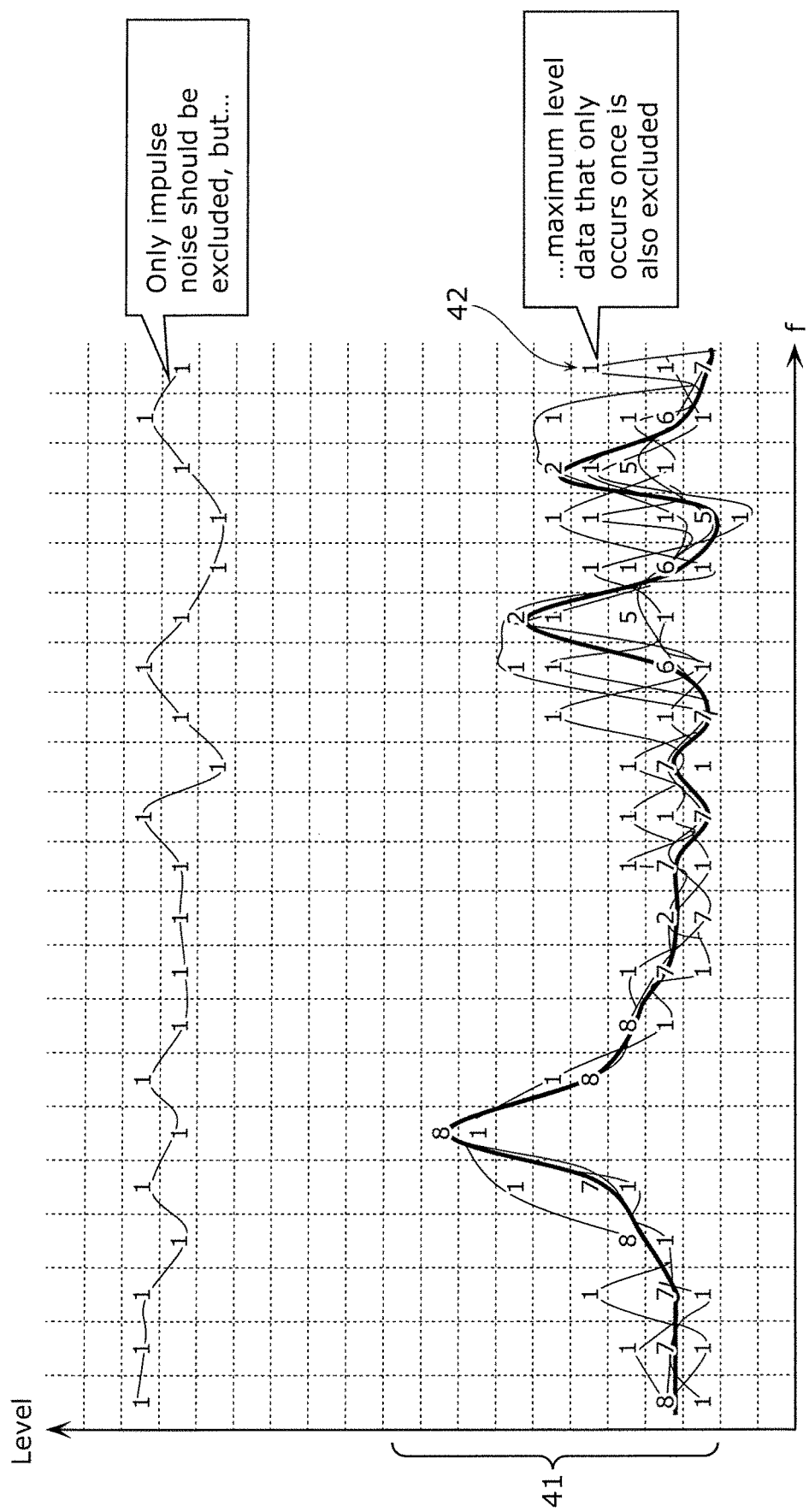
FIG. 6 illustrates a problem with the spectrum analysis apparatus according to the above embodiment.

FIG. 6 illustrates such a problem with the spectrum analysis apparatus 20 according to the above embodiment. FIG. 6 shows the 10 spectrums subject to the Max Hold (thin solid lines) and the spectrum resulting from the Max Hold (bold solid line) according to the above embodiment.

As FIG. 6 shows, regarding the spectrum resulting from the Max Hold (bold solid line), in spectrums 41 from which impulse noise is excluded, for example, data 42 indicating the maximum level at a frequency point is not selected in the Max Hold because the number of occurrences is 1. Stated differently, although this data is not impulse noise, it is not selected in the Max Hold because the number of occurrences is low (in this example, 1).

In view of this, the spectrum analysis apparatus according to this variation includes a function for improving upon the problem that the spectrum analysis apparatus 20 according to the above embodiment has.

More specifically, the spectrum analysis apparatus according to this variation has essentially the same configuration as the spectrum analysis apparatus 20 according to the above embodiment, but minor details regarding the function of the filter unit 23 are different. Specifically, the spectrum analysis method according to this variation differs from the spectrum analysis method illustrated in FIG. 3 according to the above embodiment with respect to minor details regarding the filtering step S12. The following will focus on the points of difference with the above embodiment.

The filter unit 23 according to this variation is the same as the above embodiment in that it identifies frequently occurring data at each of the m frequency points, where the frequently occurring data at a given frequency point is, from among the data indicating the levels at the given frequency point in the n spectrums accumulated in the storage unit 21, data whose number of occurrences exceeds the threshold received by the input unit 22, but differs from the above embodiment in that it identifies the frequently occurring data using a window of a predetermined length along the vertical axis of the spectrum (for example, spanning three marks on the vertical axis).

Figure 7:
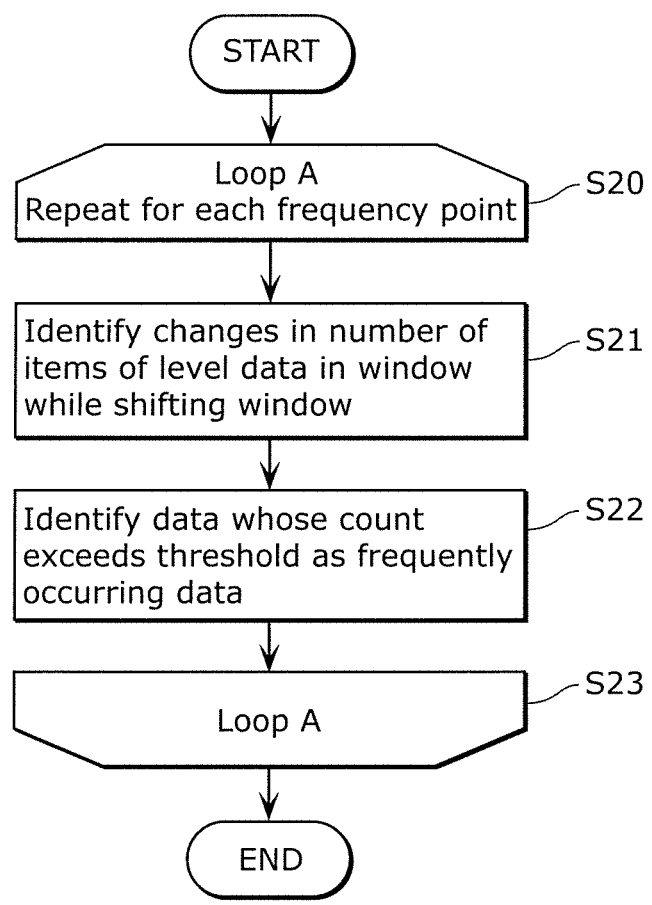
FIG. 7 is a flow chart illustrating in detail the procedures for identifying frequently occurring data performed by a filter unit according to Variation 1 of the embodiment.

FIG. 7 is a flow chart illustrating in detail the procedures for identifying the frequently occurring data performed by the filter unit 23 according to Variation 1 of the embodiment.

In this variation, the filter unit 23 repeats the following processes for each of the m frequency points in the n spectrums accumulated in the storage unit 21 (S20 through S23). The filter unit 23 arranges the data indicating levels at a given frequency point in the n spectrums in order from largest to smallest level, and in this arrangement, a window that is a predetermined number of levels long is shifted down one level at a time from a position including data indicating the highest level to a position including data indicating the lowest level in the data arranged by level to identify changes in the number of items of level data in the window (S21).

Then, the filter unit 23 identifies, as the frequently occurring data, data whose count exceeds the threshold received by input unit 22 from among the identified changes in data count (S22).

Figure 8:
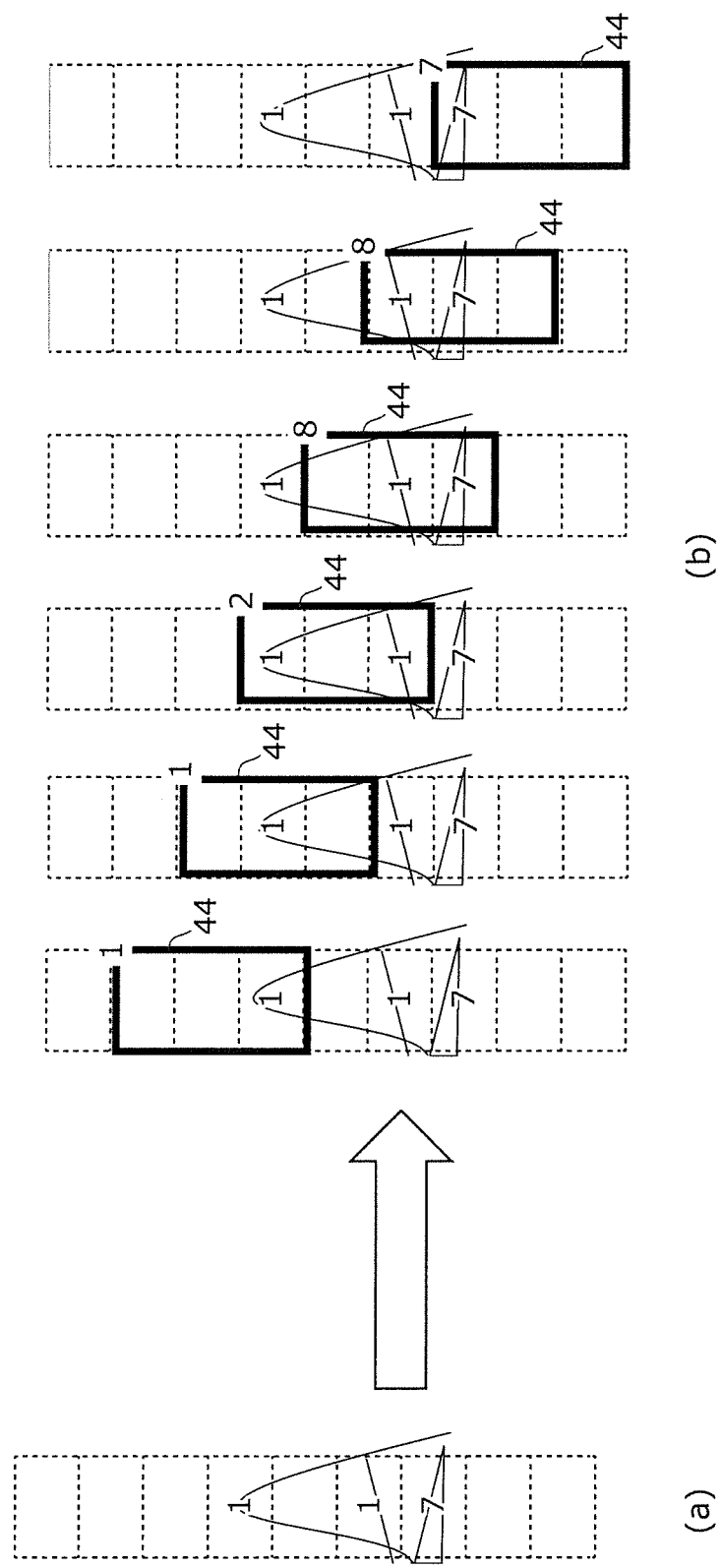
FIG. 8 illustrates an example of the identifying of frequently occurring data by the filter unit according to Variation 1 of the embodiment.

FIG. 8 illustrates an example of the identifying of the frequently occurring data by the filter unit 23 according to Variation 1 of the embodiment. More specifically, FIG. 8 illustrates a method of identifying frequently occurring data using the data at the frequency point on the far right (the highest frequency point) on the horizontal axis in the spectrums 41 in FIG. 6 from which impulse noise is excluded.

As illustrated in (a) in FIG. 8, in the spectrums 41 at this frequency point, from high to low level, items of data whose numbers of occurrences are 1, 1, and 7 are arranged. As illustrated in FIG. 8 ((b) in FIG. 8), window 44, which is a vertically long rectangle (in this example, three marks long), is shifted down one level at a time from a position including data indicating the highest level to a position including data indicating the lowest level in the data arranged by level. FIG. 8 shows the change in the number of items of level data as window 44 moves down (the number of items of level data for each position is displayed in the top right corner of each window). In this example, the number of items of data changes as follows: 1, 1, 2, 8, 8, and 7.

In this way, with the filter unit 23 according to this variation, at this frequency point, the number of items (i.e., number of occurrences) of data in order from highest to lowest level is converted from the original order of 1, 1, and 7, to 1, 1, 2, 8, 8, and 7. Then, data in the arranged converted data that exceeds a threshold (for example, 1) is identified as frequently occurring data (at the frequency point in this example: 2, 8, 8, and 7).

The Max Hold unit 24 selects a maximum level at each of the frequency points from among the frequently occurring data identified by the filter unit 23 (Max Hold step S13). Using the above frequency point as an example, the maximum level (i.e., the level indicated by the data whose number of occurrences is 2) is selected from among the data identified as frequently occurring data by the filter unit 23 (i.e., 2, 8, 8, and 7).

Figure 9:
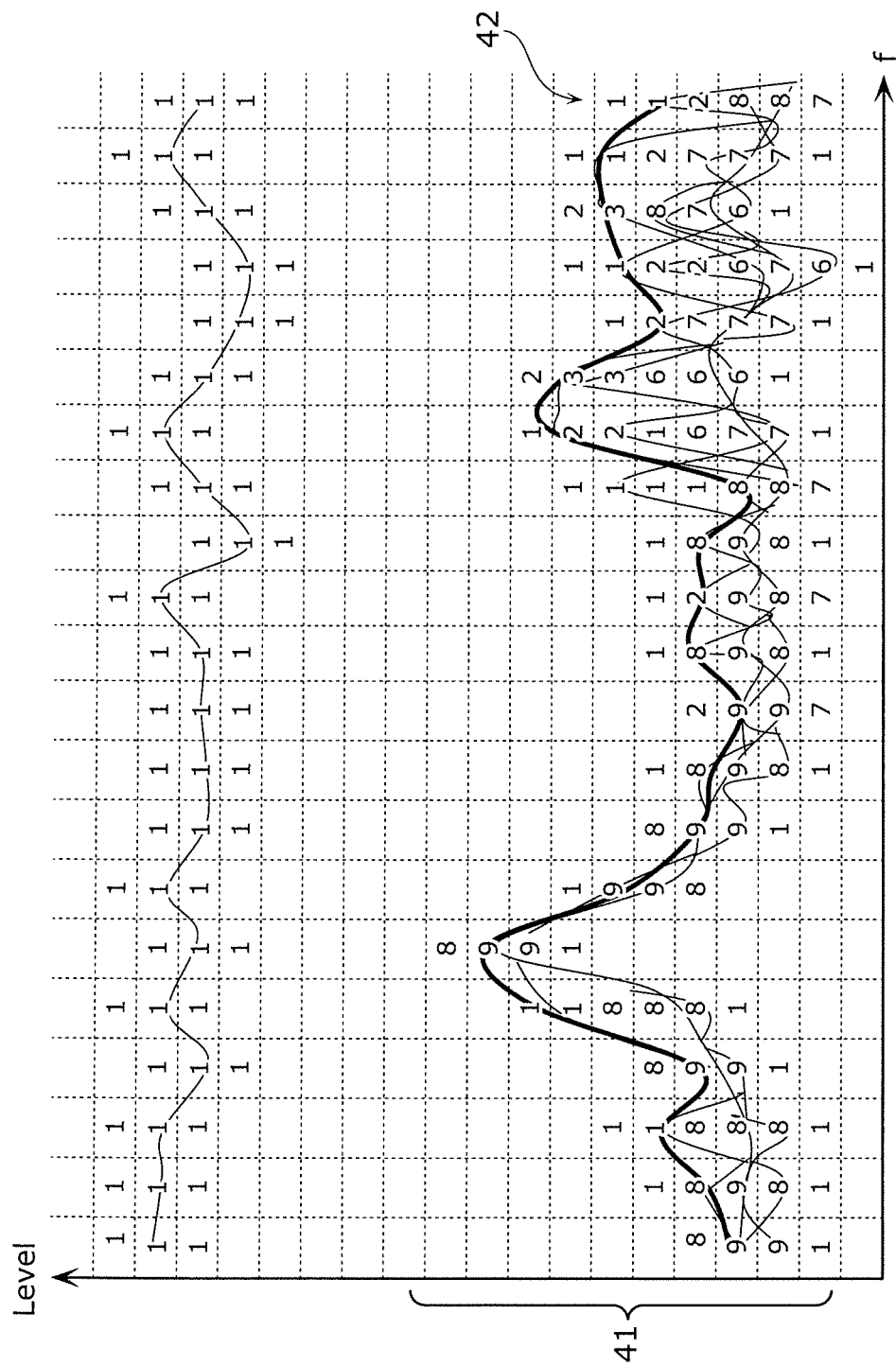
FIG. 9 illustrates an example of a spectrum resulting from Max Hold performed by a spectrum analysis apparatus according Variation 1 of the embodiment.

FIG. 9 illustrates an example of a spectrum resulting from Max Hold performed by the spectrum analysis apparatus according Variation 1 of the embodiment. In FIG. 9, the thin solid lines represent the spectrums accumulated in the storage unit 21, the values represent the items of data converted by the filter unit 23 (i.e., the changes in number of items of data obtained using a window at each frequency point), and the bold solid line represents the data selected by the Max Hold unit 24.

As can be seen by comparing FIG. 9 with the results in the above embodiment (FIG. 4, FIG. 6), with the spectrum analysis apparatus and method according to this variation, in the spectrums 41 from which impulse noise is excluded, the majority of data that indicates the maximum level at a given frequency point and whose number of occurrences is 1, such as data 42, is included in the data to be subjected to the Max Hold result (i.e., is not excluded).

As described above, with the spectrum analysis apparatus according to this variation, the data indicating levels at a given frequency point in the n spectrums is arranged in order from largest to smallest level, and in this arrangement, a window that is a predetermined number of levels long is shifted down one level at a time from a position including data indicating the highest level to a position including data indicating the lowest level in the data arranged by level to identify changes in the number of items of level data in the window. The frequently occurring data is the data that occurs more than the threshold received in the receiving step from among the identified changes in the number of items of level data.

With this, in the spectrums from which impulse noise is excluded, data can be inhibited from being excluded from the data to be subjected to Max Hold, even if it is infrequency data. Stated differently, a result is obtained that is similar to a Max Hold result in which only infrequent data that is impulse noise is excluded.

Note that the post-processing unit 26 according to this variation performs post-processing on the frequency corresponding to the highest level in the spectrum generated by the filter unit 23 and the Max Hold unit 24. With this, the merits of the spectrum analysis apparatus according this variation are utilized, and it is easy to determine whether or not the measured noise is noise that coincides with the exceptions in Annexes A and C of CISPR 32, Edition 2 described above.

Variation 2

Next, a spectrum analysis apparatus and method according to Variation 2 of the above embodiment will be described.

The spectrum analysis apparatus according to Variation 1 of the embodiment yields a result that is similar to, but not exactly the same as a Max Hold result in which only infrequent data that is impulse noise is excluded. In other words, there is a problem with the spectrum analysis apparatus according to Variation 1 that some data other than impulse noise is still excluded from the data to be subjected to the Max Hold.

Figure 10:
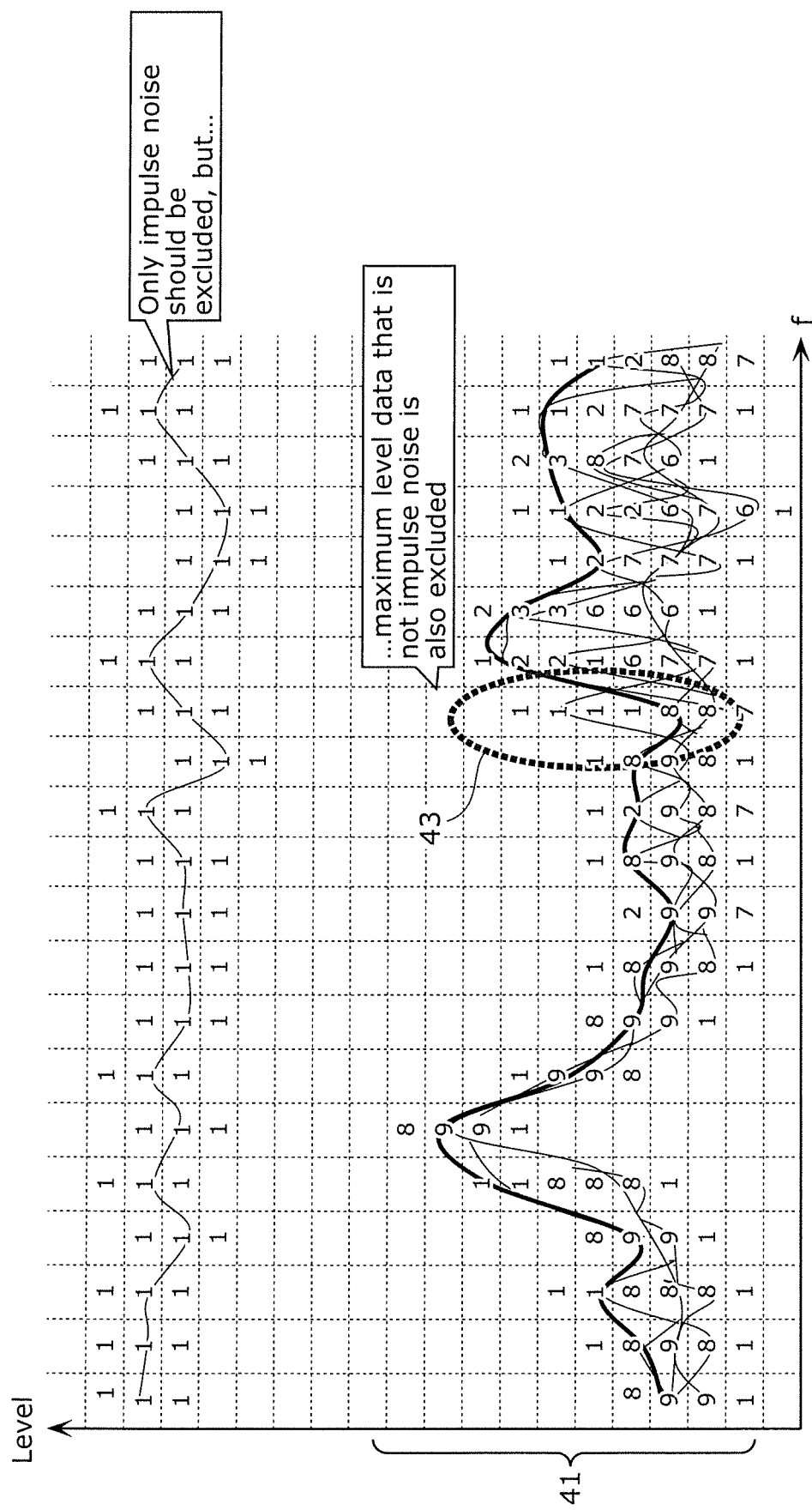
FIG. 10 illustrates a problem with the spectrum analysis apparatus according to Variation 1 of the above embodiment.

FIG. 10 illustrates this problem with the spectrum analysis apparatus according to Variation 1 of the above embodiment. FIG. 10 indicates an imperfect area 43 in the Max Hold result produced by the spectrum analysis apparatus according to Variation 1 of the above embodiment (i.e., the result in FIG. 9). In the area 43 illustrated in FIG. 10, the number of items (i.e., the number of occurrences) of data arranged from high to low level is 1, 1, 1, 1, 8, and 8. As a result, since the first four numbers of occurrences of 1, 1, 1, and 1 counting from the maximum level do not exceed the threshold of 1, even though the levels these items of data indicate are high, they are excluded from the data to be subjected to the Max Hold. In other words, data that indicates a high level but whose number of occurrences is 1 is excluded from the data to be subjected to the Max Hold even though this data is not impulse noise.

In view of this, the spectrum analysis apparatus according to this variation includes a function for improving upon the problem that the spectrum analysis apparatus according Variation 1 has.

More specifically, the spectrum analysis apparatus according to this variation has essentially the same configuration as the spectrum analysis apparatus 20 according to the above embodiment, but minor details regarding the function of the filter unit 23 are different. The following will focus on the points of difference with the above embodiment.

The filter unit 23 according to this variation is the same as the above embodiment in that it identifies frequently occurring data at each of the m frequency points, where the frequently occurring data at a given frequency point is, from among the data indicating the levels at the given frequency point in the n spectrums accumulated in the storage unit 21, data whose number of occurrences exceeds the threshold received by the input unit 22, but differs from the above embodiment in that it identifies, as the frequently occurring data, each of the n spectrums accumulated in the storage unit 21 that includes more than a predetermined number of items of data whose numbers of occurrences exceed the threshold received by the input unit 22.

Figure 11:
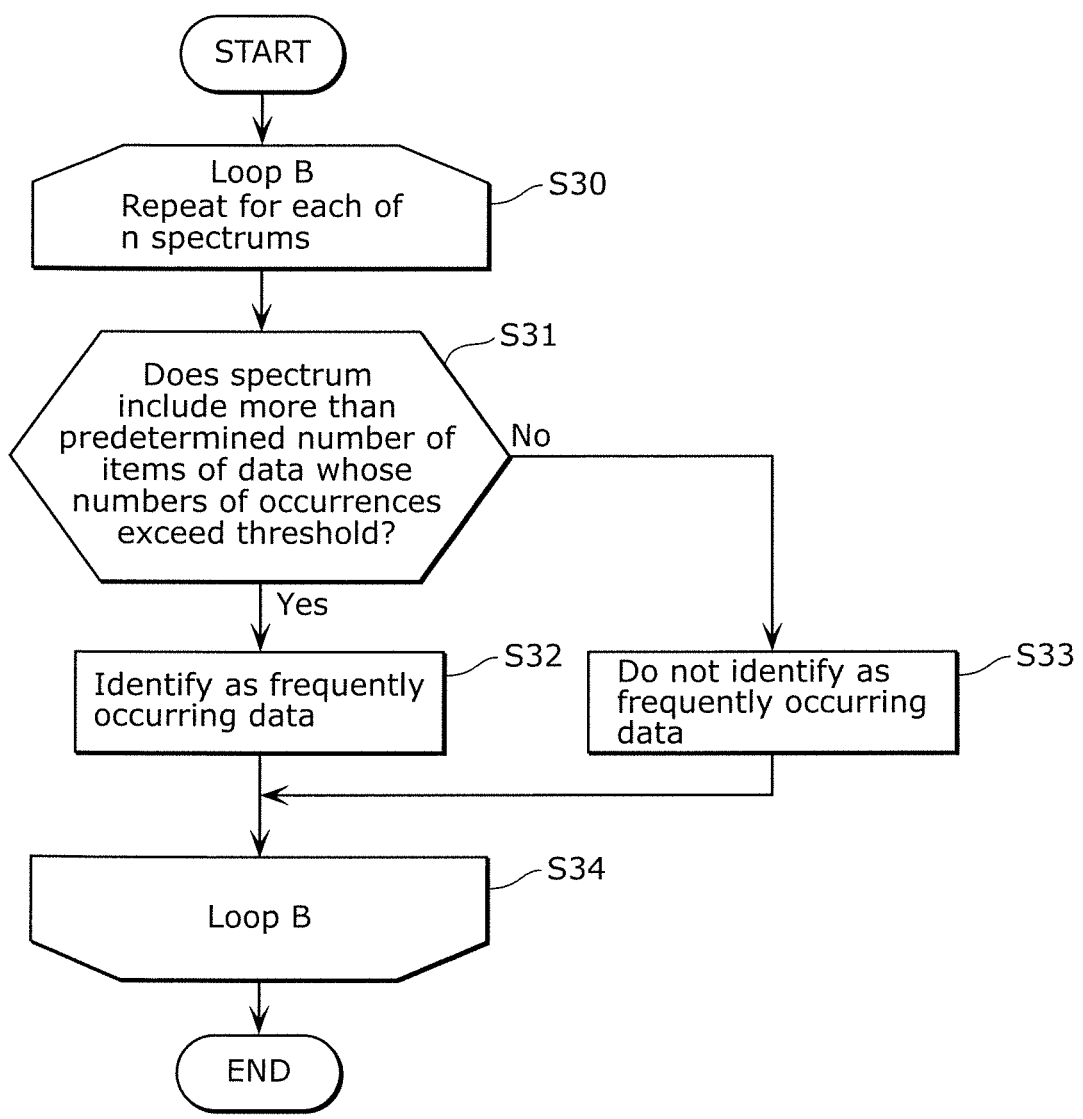
FIG. 11 is a flow chart illustrating in detail the procedures for identifying frequently occurring data performed by a filter unit according to Variation 2 of the embodiment.

FIG. 11 is a flow chart illustrating in detail the procedures for identifying the frequently occurring data performed by the filter unit 23 according to Variation 2 of the embodiment.

In this variation, the filter unit 23 repeats the following processes for each of the n spectrums accumulated in the storage unit 21 (S30 through S34). First, the filter unit 23 determines whether a spectrum includes more than a predetermined number of items of data whose numbers of occurrences exceed the threshold received by the input unit 22 (S31). Note that the predetermined number is, for example, a value specified by the user via the input unit 22. Moreover, the filter unit 23 may make this determination after implementing the data conversion using the window described in Variation 1, and, alternatively, may make this determination without implementing the data conversion using the window described in Variation 1.

As a result, when the filter unit 23 determines that the spectrum includes more than a predetermined number of items of data whose numbers of occurrences exceed the threshold (yes in S31), the filter unit 23 identifies the spectrum as frequently occurring data (S32). However, when the filter unit 23 determines that the spectrum does not include more than a predetermined number of items of data whose numbers of occurrences exceed the threshold (no in S31), the filter unit 23 does not identify the spectrum as frequently occurring data (S33).

With this, rather than determining whether data is to be excluded or included in the data to be subjected to the Max Hold on a per frequency point basis like in the above embodiment and Variation 1, whether data is to be excluded or included in the data to be subjected to the Max Hold is determined on a per spectrum basis.

The Max Hold unit 24 selects a maximum level at each of the frequency points from among the frequently occurring data identified by the filter unit 23 (i.e., from one or more spectrums including more than a predetermined number of items of data whose numbers of occurrences exceed the threshold) (Max Hold step S13).

Figure 12:
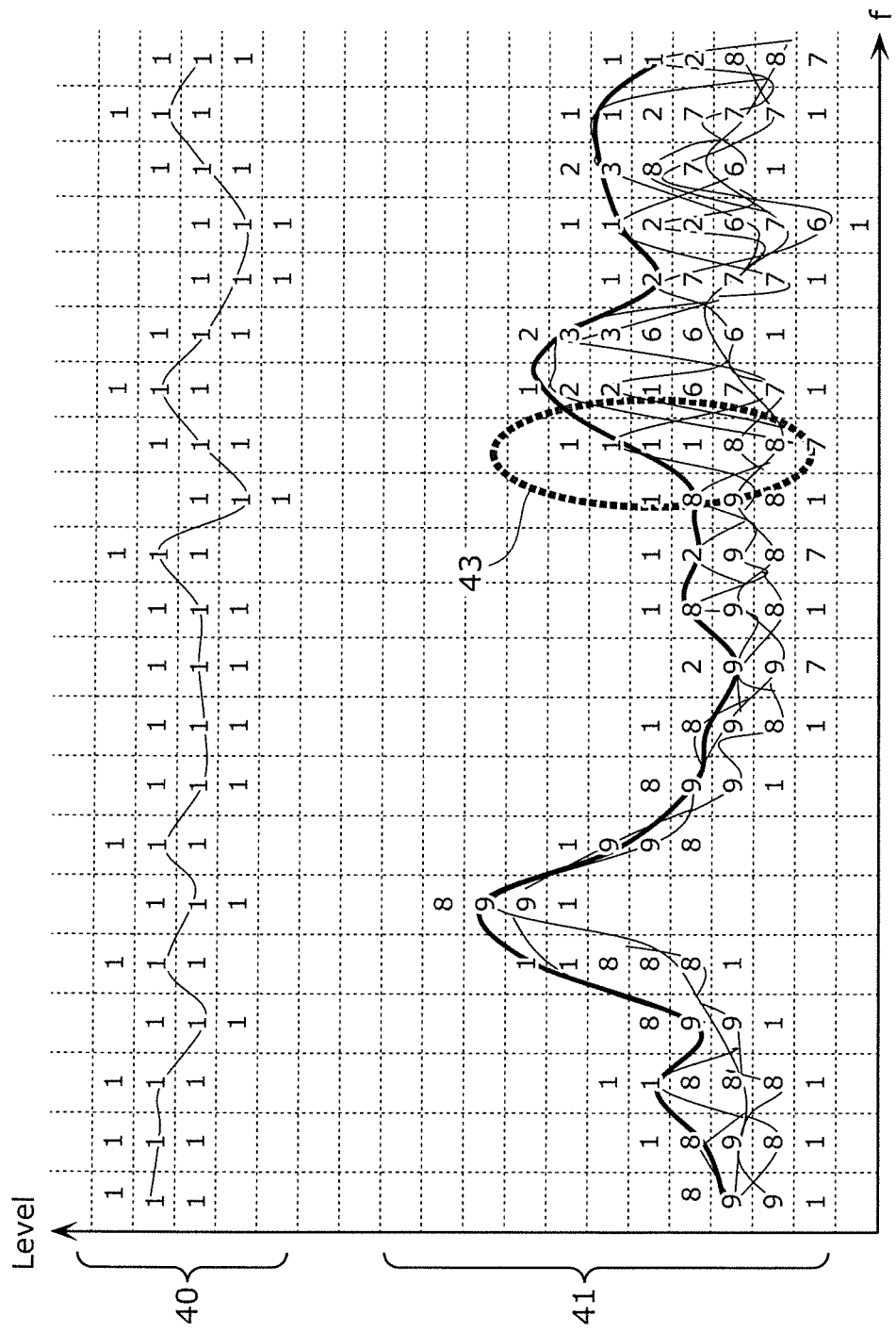
FIG. 12 illustrates an example of a spectrum resulting from Max Hold performed by a spectrum analysis apparatus according Variation 2 of the embodiment.

FIG. 12 illustrates an example of a spectrum resulting from Max Hold performed by the spectrum analysis apparatus according Variation 2 of the embodiment. FIG. 12 illustrates an example obtained as a result of the filter unit 23 determining whether data is to be subjected to the Max Hold or not on a per spectrum basis, from among data that has been converted using the window described in Variation 1. In FIG. 12, the thin solid lines represent the spectrums accumulated in the storage unit 21, the values represent the items of data converted by the filter unit 23 (i.e., the changes in number of items of data obtained using a window at each frequency point), and the bold solid line represents the data selected by the Max Hold unit 24. The predetermined number used when determining whether data is to be subjected to the Max Hold or not is set to 10 of the total 21 frequency points.

As FIG. 12 shows, spectrum 40 of impulse noise does not include any data whose number of occurrences exceeds the threshold of 1, so the predetermined number of 10 is not exceeded. Accordingly, none of this data is considered to be frequently occurring data, and is excluded from the data to be subjected to the Max Hold.

On the other hand, each of the spectrums 41 from which impulse noise is excluded includes more than the predetermined number of 10 items data whose numbers of occurrences exceed the threshold of 1, so each of the spectrums is treated as frequently occurring data, and is subjected to the Max Hold. As a result, even the data in area 43 that was imperfect in Variation 1 is subjected to the Max Hold, and thus the problem that data other than impulse noise is excluded from the Max Hold is solved. Stated differently, a Max Hold result in which only infrequent impulse noise is excluded is obtained.

As described above, with the spectrum analysis apparatus and method according to this variation, the filter unit 23 (or filtering step S12) identifies, as frequently occurring data, each of then spectrums accumulated in the storage unit 21 that includes more than a predetermined number of items of data whose numbers of occurrences exceed the threshold received by the input unit 22.

With this, in the spectrums from which impulse noise is excluded, data can be prevented from being excluded from the data to be subjected to Max Hold, even if it is infrequency data. Stated differently, a Max Hold result in which only infrequent impulse noise is excluded is obtained.

Note that the post-processing unit 26 according to this variation performs post-processing on the frequency corresponding to the highest level in the spectrum generated by the filter unit 23 and the Max Hold unit 24. With this, the merits of the spectrum analysis apparatus according this variation are utilized, and it is easy to determine whether or not the measured noise is noise that coincides with the exceptions in Annexes A and C of CISPR 32, Edition 2 described above.

Hereinbefore, a spectrum analysis apparatus and method according to the present invention have been described based on an embodiment and variations thereof, but the present invention is not limited to the embodiment and the variations thereof. Various modifications to the embodiment and variations thereof as well as embodiments resulting from arbitrary combinations of elements of the embodiment and variations thereof that may be conceived by those skilled in the art are intended to be included within the scope of the present invention as long as these do not depart from the main purport of the present invention.

For example, in the embodiment, the spectrum analysis apparatus 20 includes the post-processing unit 26, but the spectrum analysis apparatus 20 need not include the post-processing unit 26. This is because the object of the present invention, namely that Max Hold can be performed using a FFT-based spectrum analyzer on the targeted frequently occurring noise without being adversely affected by infrequent impulse noise generated during measurement, can be achieved via the Max Hold unit 24. The post-processing unit 26 is an optional element that makes it easy to determine whether or not the measured noise is noise that coincides with the exceptions in Annexes A and C of CISPR 32, Edition 2 described above, using the results of the Max Hold unit 24.

Moreover, in the embodiment, the scale of the vertical axis (indicating level) arbitrarily set for Max Hold is exemplified as a value equal to 100 times the resolution of the level of the spectrum analyzer, but the scale is not limited to this example. The scale of the vertical axis (indicating level) arbitrarily set for Max Hold may be a value equal to a product of an arbitrary factor of 1 or more and the resolution (for example, 0.01 dB) of the level of the spectrum analyzer and, alternatively, may be a fixed value independent of the spectrum equalizer (for example, 5 dB).

Moreover, in Variation 1, the window is exemplified as spanning three marks on the vertical axis of the spectrum graph, but the length of the window is not limited to this example. The window may be set to some other length and, alternatively, may be an arbitrary length specified by the user via the input unit 22.

Moreover, in the above embodiment and the like, an example is given in which an EUT is rotated one full rotation on a turntable over 10 seconds, noise radiating from the EUT while the turn table is rotating is fast Fourier transformed 10 times to generate 10 spectrums, and Max Hold is performed on the 10 spectrums. However, this example is not limiting. Max Hold may be performed on a plurality of spectrums obtained by varying the height of an antenna while the turntable is fixed in place, a plurality of spectrums obtained while the turntable is fixed in place and the height of the antenna is fixed in place, and a plurality of spectrums of noise emitted from an EUT disposed independently of the turntable.

Moreover, the spectrum analysis apparatus according to the above embodiment is exemplified as being used to measure radiated disturbance, but the application of the spectrum analysis apparatus is not limited to this example. For example, the spectrum analysis apparatus may be used for analyzing the frequencies of signals indicating a variety of physical phenomena.

Moreover, in addition to the spectrum analysis apparatus and spectrum analysis method according to the above embodiment and the like, the present invention can be realized as a program for causing a computer to execute some or all of the steps in the spectrum analysis method according to the above embodiment and the like, or as a non-transitory computer-readable recording medium, such as a CD-ROM, having the program recorded thereon.

INDUSTRIAL APPLICABILITY

The present invention is applicable as a spectrum analysis apparatus that generates a spectrum by holding a maximum level at each frequency point over a plurality of spectrums obtained by FFT, such as a FFT-based spectrum analyzer including a Max Hold mode.

The invention claimed is:

1. A spectrum analysis method, comprising: accumulating n spectrums, each indicating a level at each of m frequency points, obtained by consecutively fast Fourier transforming an input signal n times, where n is an integer of at least 2, and m is an integer of at least 2; receiving a threshold that is included in acquired data that is input as instructions from a user; identifying, in the n spectrums accumulated in the accumulating, frequently occurring data that includes data whose number of occurrences exceeds the threshold received in the receiving, the number of occurrences being defined as a total number of items of data at a same frequency point that indicate levels that are close to each other, to within a predetermined range; selecting a maximum level at each of the m frequency points from among only the frequently occurring data identified in the identifying; and outputting, from among the n spectrums, only a spectrum indicating the maximum levels selected at the m frequency points in the selecting, without outputting data whose number of occurrences does not exceed the threshold or data of a level that was not selected in the selecting, wherein levels that are close to each other, to within the predetermined range, indicate a same level when level is expressed in units defined by a scale of a vertical axis of the spectrum.

2. The spectrum analysis method according to claim 1, wherein in the identifying, the frequently occurring data is identified at each of the m frequency points, the frequently occurring data at a given frequency point being, from among data indicating a level at the given frequency point in the n spectrums accumulated in the accumulating, the data whose number of occurrences exceeds the threshold received in the receiving.

3. The spectrum analysis method according to claim 2, wherein the frequently occurring data is, from among the data indicating a level at the given frequency point in the n spectrums, items of data that indicate a same level and occur more than the threshold received in the receiving.

4. The spectrum analysis method according to claim 2, wherein when the data indicating a level at the given frequency point in the n spectrums is arranged in order from largest to smallest level and, in this arrangement, a window that is a predetermined number of levels long is shifted down one level at a time from a position including data indicating a highest level to a position including data indicating a lowest level in the data arranged by level to identify changes in a total number of items of data indicating a level in the window, the frequently occurring data is, in the identified changes in the total number of items of the data indicating a level, data that occurs more than the threshold received in the receiving step.

5. The spectrum analysis method according to claim 1, wherein in the identifying, each of the n spectrums accumulated in the accumulating that includes more than a predetermined number of items of data whose numbers of occurrences exceed the threshold received in the receiving is identified as the frequently occurring data.

6. The spectrum analysis method according to claim 1, further comprising:
post-processing including obtaining time-variant data indicating changes over time in a level of a frequency corresponding to a highest level in the spectrum indicating the maximum levels selected at the m frequency points in the selecting, and calculating and outputting durations of time that the obtained time-variant data exceeds a specified upper limit and an interval of time between events exceeding the specified upper limit.

7. A non-transitory computer-readable recording medium for use in a computer, the recording medium having recorded thereon a computer program for causing the computer to execute the spectrum analysis method according to claim 1.

8. A spectrum analysis apparatus, comprising: a storage unit configured to accumulate n spectrums, each indicating a level at each of m frequency points, obtained by consecutively fast Fourier transforming an input signal n times, where n is an integer of at least 2, and m is an integer of at least 2; an input unit configured to receive a threshold; a filter unit configured to identify, in the n spectrums accumulated by the storage unit, frequently occurring data that includes data whose number of occurrences exceeds the threshold received by the input unit, the number of occurrences being defined as a total number of items of data at a same frequency point that indicate levels that are close to each other, to within the predetermined range; a Max Hold unit configured to select a maximum level at each of the m frequency points from among only the frequently occurring data identified by the filter unit; and an output unit configured to output, from among the n spectrums, only a spectrum indicating the maximum levels selected at the m frequency points by the Max Hold unit, without outputting data whose number of occurrences does not exceed the threshold or data of a level that was not selected in the selecting, wherein levels that are close to each other, to within a predetermined range, indicate a same level when level is expressed in units defined by a scale of a vertical axis of the spectrum.

* * * * *